United States Patent
Wong et al.

(10) Patent No.: US 8,576,574 B2
(45) Date of Patent: Nov. 5, 2013

(54) ELECTROMAGNETIC INTERFERENCE SHIELDING ON SEMICONDUCTOR DEVICES

(75) Inventors: Wingshenq Wong, Singapore (SG); David Gani, Singapore (SG); Glenn De Los Reyes, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 554 days.

(21) Appl. No.: 12/764,704

(22) Filed: Apr. 21, 2010

(65) Prior Publication Data

US 2011/0261550 A1    Oct. 27, 2011

(51) Int. Cl.
*H05K 1/18* (2006.01)

(52) U.S. Cl.
USPC ........... 361/764; 361/760; 361/782; 361/803; 361/816

(58) Field of Classification Search
USPC ......... 361/782–784, 803, 760–763, 816, 818; 174/51, 520–527; 257/787–790
See application file for complete search history.

(56) References Cited

U.S. PATENT DOCUMENTS

| | | | |
|---|---|---|---|
| 4,714,633 A | 12/1987 | Horiki et al. | |
| 6,625,036 B1 * | 9/2003 | Horio | 361/760 |
| 6,797,890 B2 * | 9/2004 | Okubora et al. | 174/260 |
| 6,800,171 B2 | 10/2004 | Van Tyle | |
| 7,720,374 B2 | 5/2010 | Kim et al. | |
| 2006/0145361 A1 * | 7/2006 | Yang et al. | 257/787 |
| 2006/0208347 A1 * | 9/2006 | Kim | 257/678 |
| 2007/0052827 A1 | 3/2007 | Hiltunen | |
| 2008/0185603 A1 | 8/2008 | Itoi et al. | |
| 2009/0134483 A1 | 5/2009 | Weng et al. | |
| 2009/0184403 A1 * | 7/2009 | Wang et al. | 257/659 |
| 2010/0117176 A1 | 5/2010 | Uekawa | |
| 2010/0118182 A1 | 5/2010 | Fujii et al. | |
| 2010/0165172 A1 | 7/2010 | Kawazu | |
| 2011/0255000 A1 | 10/2011 | Weber et al. | |
| 2012/0070145 A1 | 3/2012 | Wong et al. | |

* cited by examiner

*Primary Examiner* — Tuan T Dinh
(74) *Attorney, Agent, or Firm* — Seed IP Law Group PLLC

(57) ABSTRACT

A conductive paint electromagnetic interference (EMI) shield for an electronic module or device. The conductive paint is composed of metal particles suspended in a fluidic carrier. In one embodiment, the conductive paint is sprayed onto exterior surfaces of an electronic module or device from a spray gun. The sprayed conductive paint is cured to remove the fluidic carrier, leaving a metal film coated to the outside of the module or device. In one embodiment used with electronic packages in array form, grooves are cut into an encapsulation material of a module so that the shield protection includes sidewalls of the package. In another embodiment used with camera modules, masking is used to selectively shield portions of the module. In a further embodiment, the shield is electrically connected to a ground conductor of a circuit of the electronic module.

9 Claims, 16 Drawing Sheets

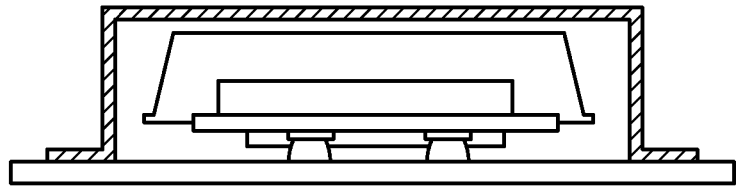
_FIG.1_ _(Prior Art)_
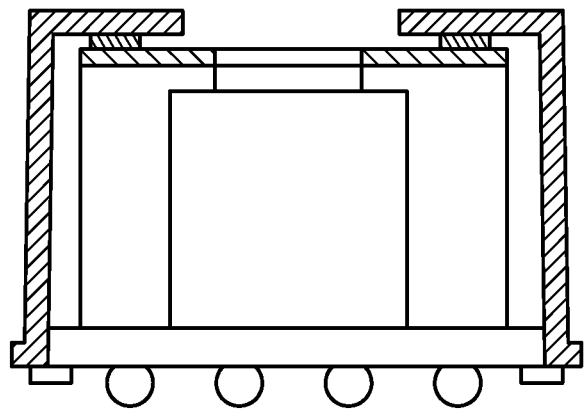
_FIG.2_ _(Prior Art)_

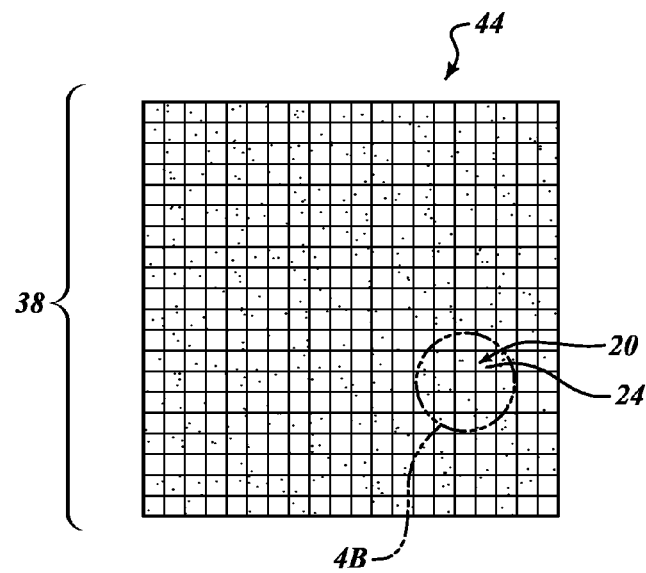
*FIG.4A*
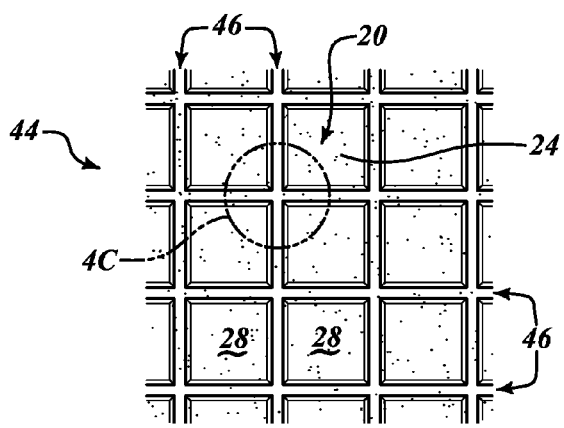 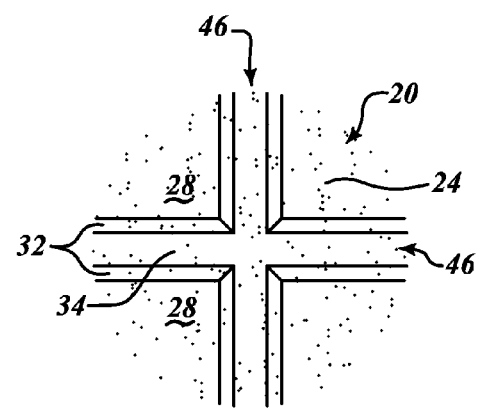
*FIG.4B*   *FIG.4C*

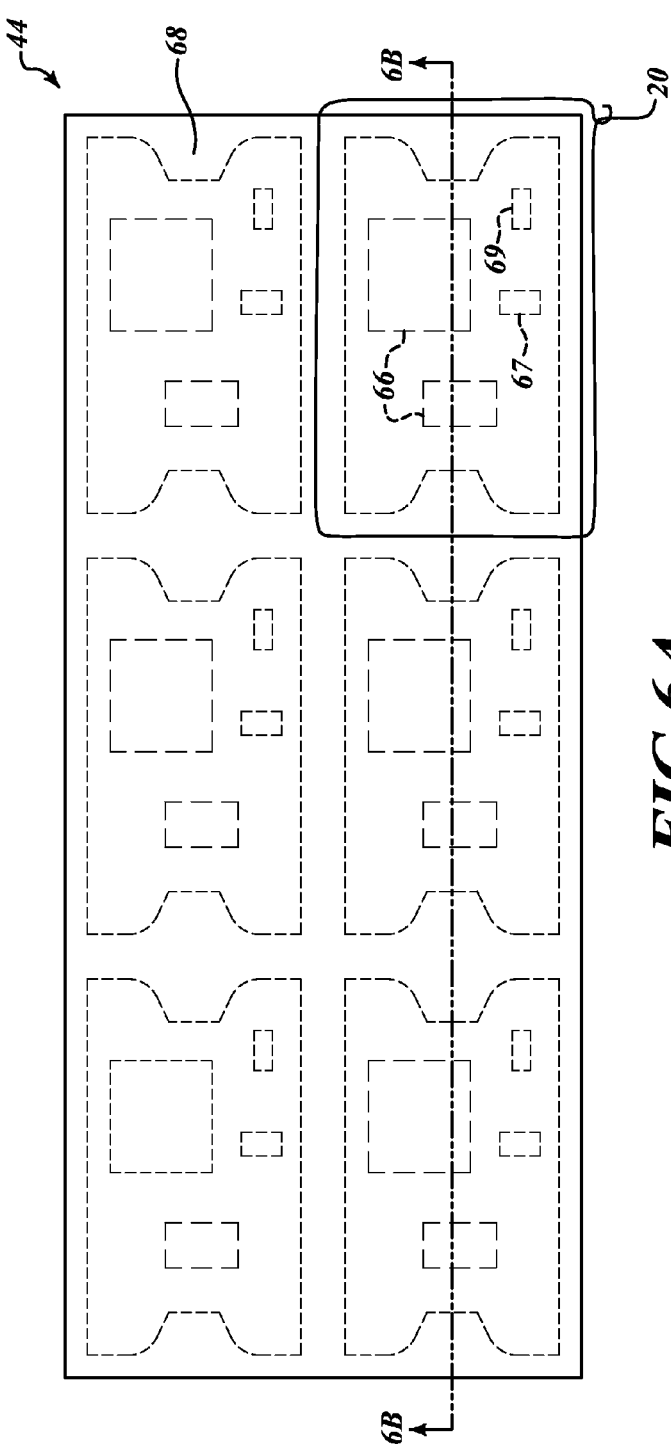
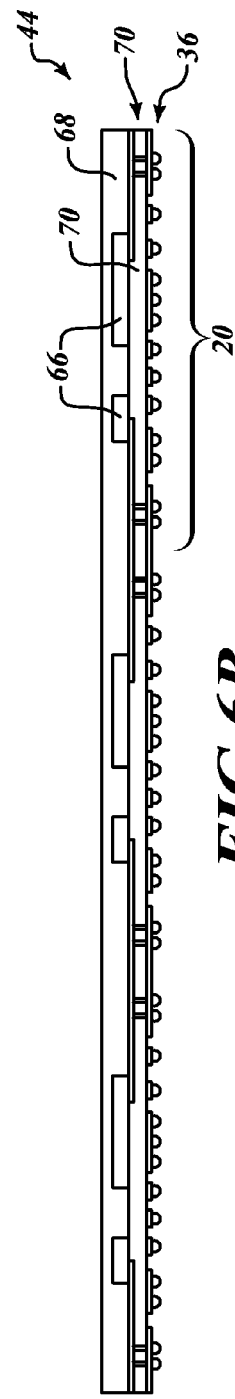

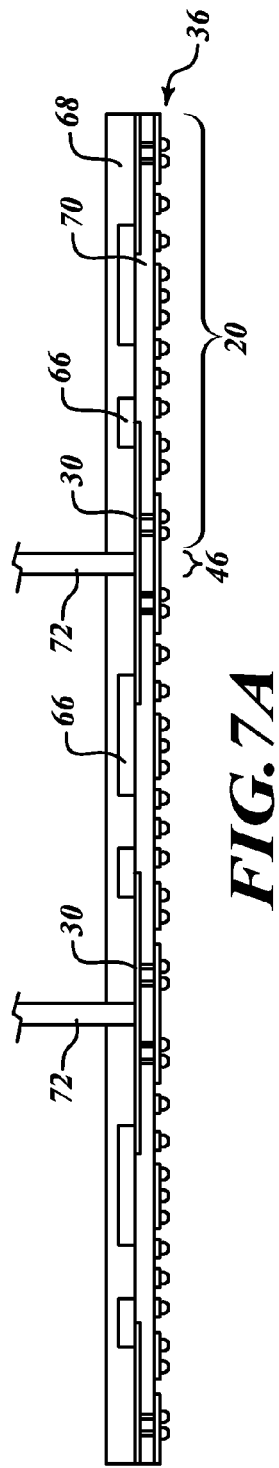
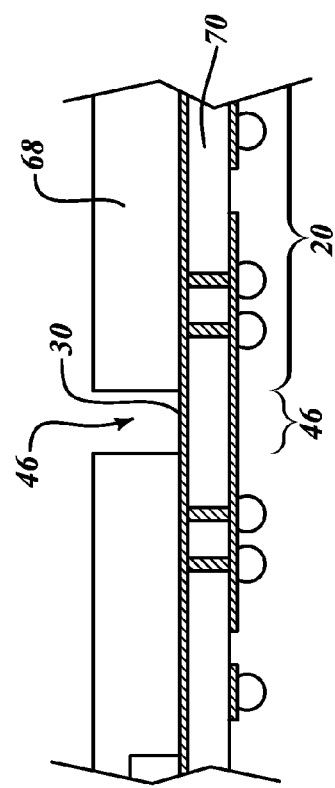

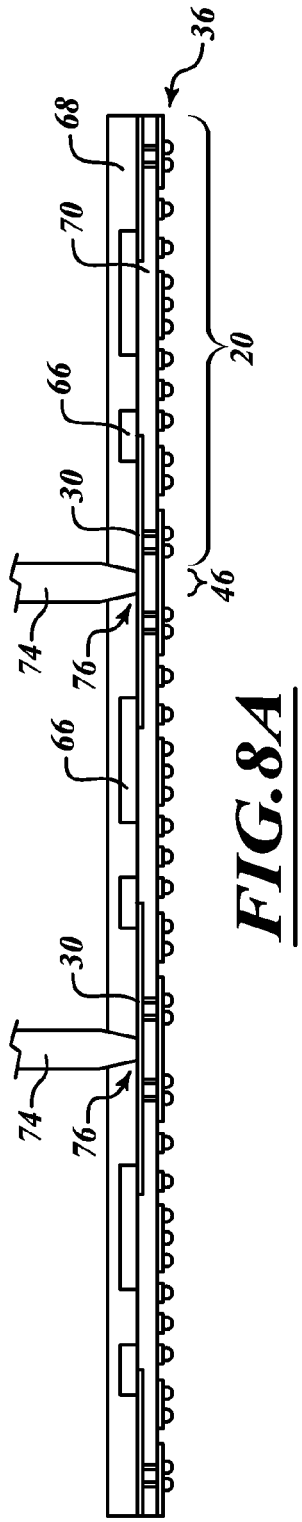
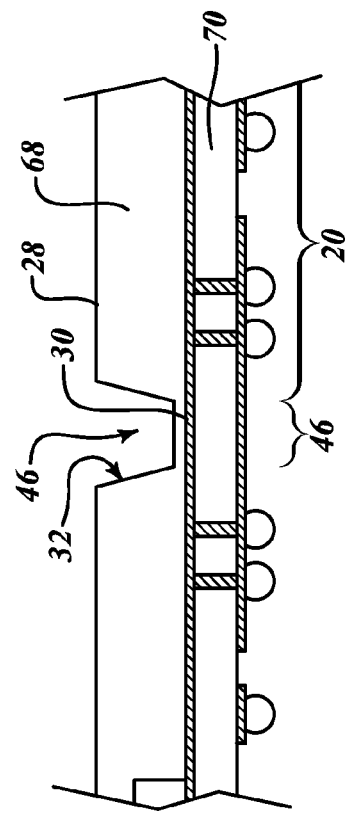

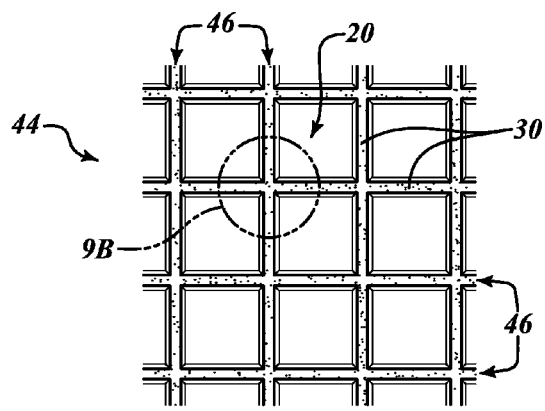
*FIG.9A*
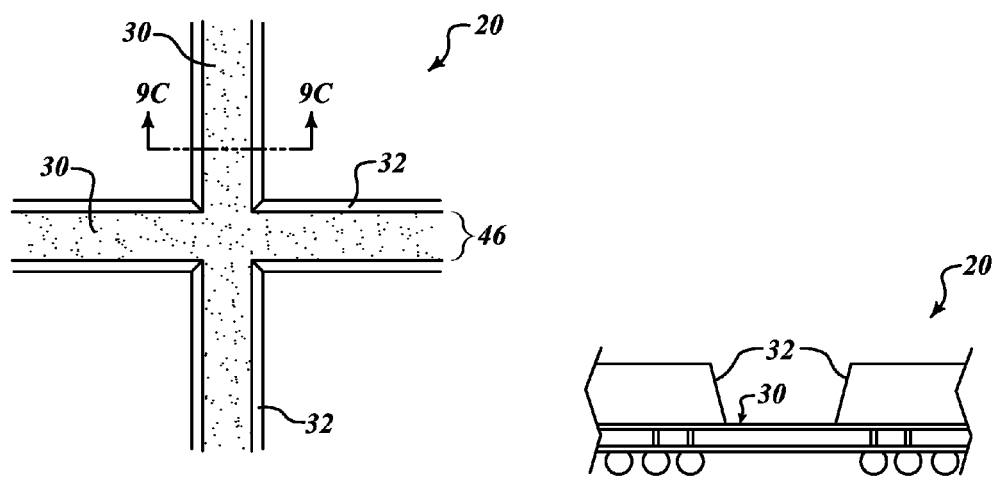
*FIG.9B*          *FIG.9C*

ELECTROMAGNETIC INTERFERENCE SHIELDING ON SEMICONDUCTOR DEVICES

BACKGROUND

1. Technical Field

This description generally relates to the field of electronic devices and, in particular, to electromagnetic interference shielding of electronic devices.

2. Description of the Related Art

Electronic devices commonly require electromagnetic interference (EMI) shielding to prevent disruption of their performance due to electromagnetic fields in their operating environment. An EMI shield is typically one of a variety of metal containers that envelops an electronic device and is electrically connected to a ground reference of the device. The shield limits penetration of an EMI field to a circuit of the device by attenuating the EMI field before it reaches the device. The particular EMI shield selected for a device typically depends on the type of device requiring shielding.

For packaged electronic devices, including ball grid array (BGA) electronic packages, one known shielding method uses sputtering. Sputtering, also known as chemical vapor deposition (CVD), deposits a metal film directly on the body of the package. The metal on the body is electrically connected to a ground conductor, thereby isolating the electronic circuit of the device from electromagnetic radiation outside the shield. The CVD process has the benefit of providing the device with a compact shield, which avoids an undesirable increase in device size due to the shield. However, CVD is relatively expensive to implement and therefore increases the cost of the device.

A second known method for EMI shielding of electronic devices is a metal plate, as shown in FIG. 1. The metal plate is sized and shaped to fit over a board-mounted electronic device. Typically, the metal plate has sidewalls at its edges to mount the plate to the same PC board that the device is mounted on. The metal plate is electrically connected to a ground conductor on the PC board to ground the plate. Although inexpensive to produce, the technique has the disadvantage of increasing the overall size of the electronic package.

A third known method for EMI shielding, and one used for EMI shielding of camera module assemblies, is a shield can, as shown in FIG. 2. The camera module assembly may include a lens and a circuit on a substrate. The lens includes an aperture in which an image can be received. As with the electronic device metal plate shield described above, the shield can is sized and shaped to fit over the camera module. The metal can may be connected to the same PC board that the device is mounted on or connected to the ground pad of the device as shown in FIG. 2. One difference from the metal plate EMI shield is that the can has an opening over the lens aperture to allow an image to pass through the can to the lens.

The shield is typically constructed from a thin pre-formed sheet of metal. There were various ways known in the prior art to attach the metal can to the substrate to provide for EMI shielding depending on module configuration. According to one known technique, the metal can is coupled with conductive glue to the PCB. While this method provides sound EMI shielding, the method increases the module assembly size and also increases production cost due to the complexity of the assembly process.

BRIEF SUMMARY

A conductive paint electromagnetic interference (EMI) shield is applied to the body of an electronic module or device in accordance with one embodiment of the invention. The conductive paint is composed of metal particles suspended in a fluidic carrier. In one embodiment, the conductive paint is sprayed onto exterior surfaces of an electronic module or device from a spray gun. The sprayed conductive paint is cured to remove the fluidic carrier, leaving a metal film coated to the outside of the module or device. In a further embodiment, the metal film is electrically connected to a ground conductor of a circuit of the electronic module.

In one embodiment, the electronic module is a packaged die. There can be one die per package or a plurality of die in one package. In one step of making the EMI shield, grooves are cut into an encapsulation material portion of the package between individual modules of the array. The grooves are cut partially through the thickness of the package to form sidewalls in each package. In one embodiment, the depth of the cut is selected to expose the back of a ground conductor layer on the bottom side of the electronic package. In another embodiment, the cut is made with a V-shaped saw blade that results in the sidewalls of each package being angled with respect to the top surface of the array. In another step of making the EMI shield, the entire array including the module is sprayed with the conductive paint while still in array form. After the steps of applying the conductive paint and curing, the modules are separated from one another in a singulation step that can include any one of saw cutting, laser cutting, or water jet cutting.

In another embodiment of the method, the electronic module is a camera module assembly. Surfaces of the camera module assembly not intended for EMI shielding are masked. In one embodiment the mask is a compliant peelable material applied directly to the surfaces of the camera module assembly not intended for EMI shielding. In another embodiment the mask is a metal element that is rested over the surfaces of the camera module assembly not intended for EMI shielding. In yet another embodiment the mask is a heat-expandable material applied directly to the surfaces of the camera module assembly not intended for EMI shielding. In another step of making the EMI shield, with the mask in place the module is sprayed with the conductive paint. In an alternate embodiment, portions of the camera module are coated with the EMI shield in a sequence of spraying and masking operations. After applying the conductive paint and curing, the mask is removed. In the embodiments of the peelable mask and the heat-expandable mask, the mask material is peeled away. In the embodiment of the metal mask, the mask is simply taken away. In one embodiment the conductive paint EMI shield is electrically connected to a ground conductor of a circuit of the camera module assembly using an electrically conductive glue.

The conductive paint EMI shield offers the advantages of providing effective EMI shielding that conforms to the shape of the module it protects, saving space and reducing the size of the module compared to known methods for EMI shielding of parts. The conductive paint EMI shield also costs less to implement compared with other methods, such as chemical vapor deposition coatings.

BRIEF DESCRIPTION OF THE SEVERAL VIEWS OF THE DRAWINGS

FIG. 1 shows a cross-sectional view of a ball grid array package having a metal plate electromagnetic interference (EMI) shield of the prior art.

FIG. 2 shows a cross-sectional view of a camera module having an EMI shield can of the prior art.

FIGS. 4A-4C show top views of an array of electronic modules having a conductive paint EMI shield in accordance with one embodiment of the invention.

FIG. 6A shows a top view of a step of a method of making a conductive paint EMI shield in accordance with one embodiment of the invention.

FIG. 6B shows a cut-away view of a step of a method of making a conductive paint EMI shield in accordance with one embodiment of the invention.

FIGS. 7A and 7B show a cut-away view of another step of a method of making a conductive paint EMI shield in accordance with one embodiment of the invention.

FIGS. 8A and 8B show a cut-away view of a step of a method of making a conductive paint EMI shield in accordance with further embodiments of the invention.

FIGS. 9A-9C show in top and cut-away views a result of a step in a method of making a conductive paint EMI shield in accordance with another embodiment of the invention.

DETAILED DESCRIPTION

Figure 3A:
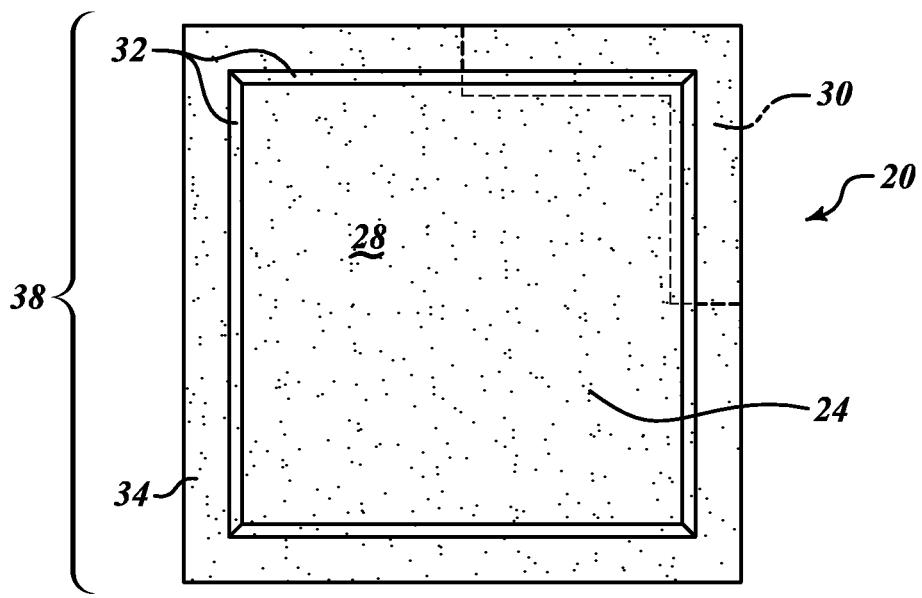
FIGS. 3A and 3B show top and side views of an electronic module having a conductive paint EMI shield in accordance with one embodiment of the invention.
Figure 3B:
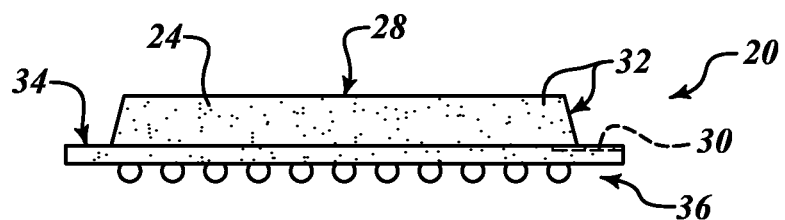

FIGS. 3A and 3B show top and side views of a ball grid array electronic package 20 having a conductive paint EMI shield 24 in accordance with principles of the present invention. In the embodiment of FIGS. 3A and 3B, the shielded electronic module 20 is a ball grid array electronic package. Any electronic module, including land grid array, dual-in-line package (DIP), quad flat package (QFP), flip chip, J-lead integrated circuit package, Power-SO package, multi-chip module, or any other of the many types of packages that can be used with this invention.

In the embodiment of FIGS. 3A and 3B, the ball grid array electronic package 20 includes the conductive paint EMI shield 24, a top surface 28, sidewalls 32, a perimeter ledge 34 and a ball grid array electrical interconnect 36. The top surface 28, sidewalls 32, and perimeter ledge 34 combine to form a total exposed surface 38 of the ball grid array electronic package 20. The ball grid array electrical interconnect 36 is on an opposite face of the ball grid array electronic package 20 from the top surface 28. The perimeter ledge 34 and the top surface 28 lie on different planes from one another, are approximately parallel with one another, and are connected by the sidewalls 32. The conductive paint EMI shield 24 covers the total exposed surface 38, including at least portions of the top surface 28, the sidewalls 32, and the perimeter ledge 34.

In a further embodiment, the perimeter ledge 34 includes on its surface a ground conductor 30, also shown in FIGS. 3A and 3B. In various further embodiments, the ground conductor 30 lies on and circumscribes a portion, or all, of the perimeter ledge 34 on the ball grid array electronic package 20. The ground conductor 30 lies beneath the conductive paint EMI shield 24 and in one further embodiment the ground conductor 30 and the conductive paint EMI shield 24 are electrically coupled to one another. In one embodiment of a method of making the conductive paint EMI shield 24, the conductive paint EMI shield 24 becomes electrically connected with the ground conductor 30 on the perimeter ledge 34 by applying the conductive paint EMI shield 24 to the perimeter ledge 34 with the conductor 30 exposed. In one embodiment, the ground conductor 30 is electrically coupled to a ground pin of a circuit on a die 66 of the ball grid array electronic package 20.

FIGS. 4A-4C show the ball grid array electronic package 20 as one of a plurality of ball grid array electronic packages in an array 44. FIGS. 4A-4C show the conductive paint EMI shield 24 applied to the ball grid array electronic package 20 while the package is still in array form. In a close-up view in FIGS. 4B and 4C, grooves 46 have been formed between each of the plurality of ball grid array electronic packages in the array 44. The bottom of grooves 46 become the perimeter ledge 34 (shown in FIGS. 3A and 3B) of the ball grid array electronic package 20 when the ball grid array electronic package 20 becomes singulated from the array. The conductive paint EMI shield 24 conforms to the total exposed surface 38 of the ball grid array electronic package 20 while in array form so that the conductive paint EMI shield 24 covers each of the top surface 28, the sidewalls 32, and the perimeter ledge 34 within the grooves 46.

In one embodiment of the invention, the sidewalls 32 of the ball grid array electronic package 20 as defined by the grooves 46 are not at right angles with respect to the top surface 28. The sidewalls 32 of the angled embodiment are evident in FIG. 3B. In this further embodiment, the angled slope of the sidewalls 32 makes the sidewalls more accessible while the ball grid array electronic package 20 is still in array form, which is beneficial during application of the conductive paint EMI shield 24, discussed herein.

Figure 5:
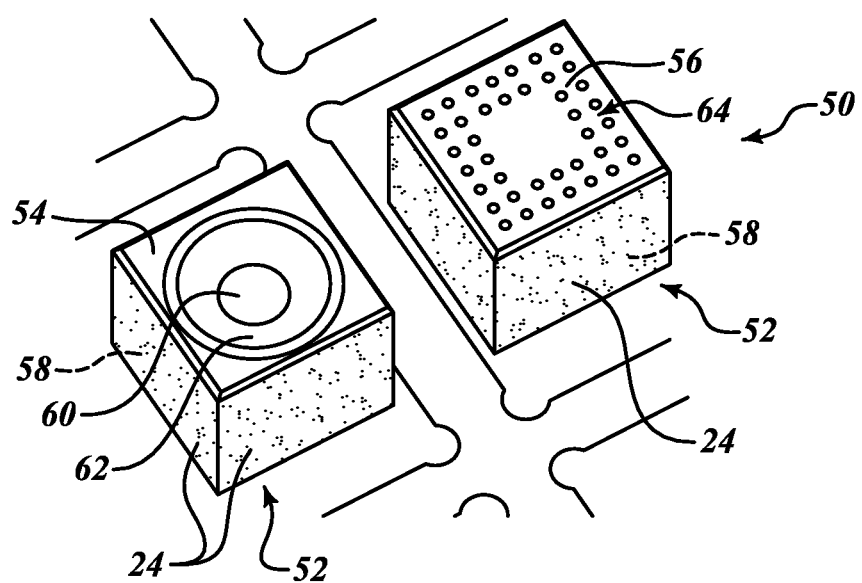
FIG. 5 shows in an isometric view top and bottom surfaces of a camera module having a conductive paint EMI shield in accordance with one embodiment of the invention.

FIG. 5 shows in perspective view a camera module 50 having the conductive paint EMI shield 24 in accordance with another embodiment of the invention. The camera module 50 includes a housing 52 having top and bottom surfaces 54, 56 and sidewalls 58. Within the housing 52 is a lens 60 that can be seen through a lens aperture 62 in the top surface 54 of the housing 52. The embodiment of the camera module 50 in FIG. 5 also has a ball grid array electrical interconnect 64 on the bottom surface 56 of the housing 52, although embodiments having other forms of electrical interconnect are considered within the scope of the invention.

In the embodiment of FIG. 5, the conductive paint EMI shield 24 covers the sidewalls 58 but not the top and bottom surfaces 52, 54 of the camera module 50. This coverage avoids interference of the conductive paint EMI shield 24 with the lens 60 on the top surface 54 and with the ball grid array electrical interconnect 64 on the bottom surface 56. Selective placement of the conductive paint EMI shield 24 on the housing 52 is accomplished using masking, as will be discussed below. Embodiments having various arrangements of the conductive paint EMI shield 24 on the surfaces of the housing 52 are still considered within the scope of the invention.

FIGS. 6-12 show steps in a method of making the conductive paint EMI shield 24 for a ball grid array electronic package 20 in accordance with one embodiment of the invention. FIG. 6A shows in a top view a cut-away line through an array 44 that includes the ball grid array electronic package 20. FIG. 6B shows in a cut-away view an interior section as exposed by the cut-away line of FIG. 6A.

In FIGS. 6A and 6B, the ball grid array electronic package 20 having multiple die therein is assembled while part of an array 44, see FIG. 4A. Each package includes two semiconductor die 66, a few passive components, such as capacitors 67 and resistors 69, substrate and an encapsulatant 68. A large substrate 70 usually has a plurality of die 66 mounted thereon in a known pattern, but one die could be provided per package or per array. The substrate is a dielectric material having one or more conductive layers 30 therein, as is well known in the art. The substrate 70 can be any acceptable type, including wafer level substrates, wafer level fabricated distribution layers, printed circuit boards. There are many acceptable techniques for forming such substrate 70 and conductive layer 30 combinations, any of which are acceptable, one is shown and described in detail in U.S. application Ser. No. 12/649,118. The assembly steps include encapsulating one or more semiconductor die 66 within an encapsulation layer 68, providing a circuit substrate 70, and placing the ball grid array electrical interconnect 36 on the substrate 70. These steps are well known in the art and thus are not discussed further herein. Similar type steps would be carried out for another type of package, including land grid array, dual-in-line package (DIP), quad flat package (QFP), flip chip, J-lead integrated circuit package, Power-SO package, single chip packages, and others. The substrate 70 may include a PC board or other type of support member.

In FIGS. 7A and 8A the ball grid array electronic package 20, while within the array 44, undergoes saw cutting. In one embodiment of the method shown in FIGS. 7A and 7B, a straight-walled blade 72 cuts a groove 46 between two electronic circuits of the array 44. The position of the groove 46 is selected to fall between individual packages of the array 44 for eventual separation of the individual packages along the groove 46.

In one embodiment of the method, the depth of the cut groove 46 is selected to pass completely through the encapsulation layer 68 molded around the die 66 and expose the ground conductor 30 at the edge of the ball grid array electronic package 20. The cutting causes the ground conductor 30 to become exposed on the perimeter ledge 34. In one embodiment, shown in FIG. 7B, the cutting depth of the straight-walled cutting blade 72 is precisely controlled to expose the ground conductor 30 but without cutting it or separating individual modules of the array 44.

In FIGS. 8A and 8B, a second embodiment of the method is shown in which a V-shaped cutting blade 74 cuts the groove 46 between two individual packages of the array 44. In this embodiment, the V-shaped cutting blade 74 has a flat bottom face, but walls of the cutting blade are tapered toward the blade's center at a tip 76 of the V-shaped cutting blade 74. As in the first embodiment of this step of the method, the position and the depth of the V-shaped cutting blade 74 are selected for eventual separation of individual modules of the array 44 and to expose a ground conductor 30 at the edge of each ball grid array electronic package 20. However, in this embodiment the V-shaped cutting blade 74 results in the sidewalls 32 of the ball grid array electronic package 20 being sloped with respect to the top surface 28 of the ball grid array electronic package 20. A sloping sidewall 32 provides better access to the sidewall 32 in a subsequent step in which the conductive paint EMI shield 24 becomes applied.

In one embodiment, shown in FIG. 8B, the depth of the saw cut has a higher tolerance and is not controlled as precisely. In this case, the cut leaves a small amount of encapsulant 68 on the top of the conductor 30. By making a saw cut to this depth, the conductor 30 is not cut, damaged, or harmed in any way. A saw cut to this depth provides for a wider margin of error in cut depth and therefore permits the cut to be done more quickly and with lower-cost equipment. Then, in a later step, the layer of encapsulant 68 remaining over the conductor 30 is removed by a method that will not risk harm to the conductor 30. For example, the thin layer of remaining encapsulant may be removed by a laser, burning or cutting, wet-etch that attacks only the encapsulant, or other technique.

Figure 8C:
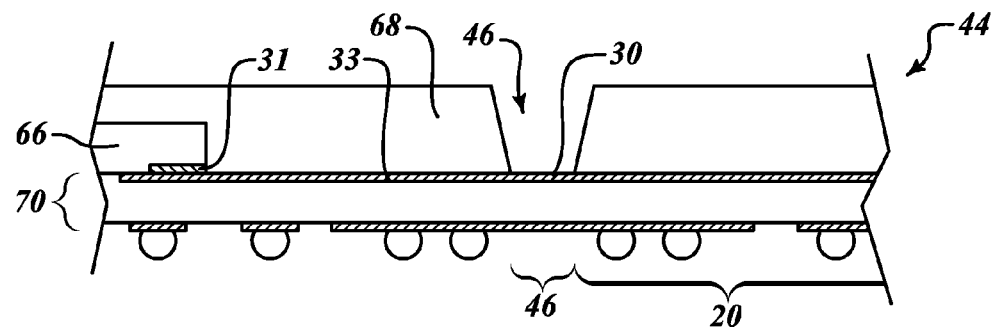
FIGS. 8C-8H show further embodiments of a method of connecting the conductive paint EMI shield to a conductor of the package.
Figure 8D:
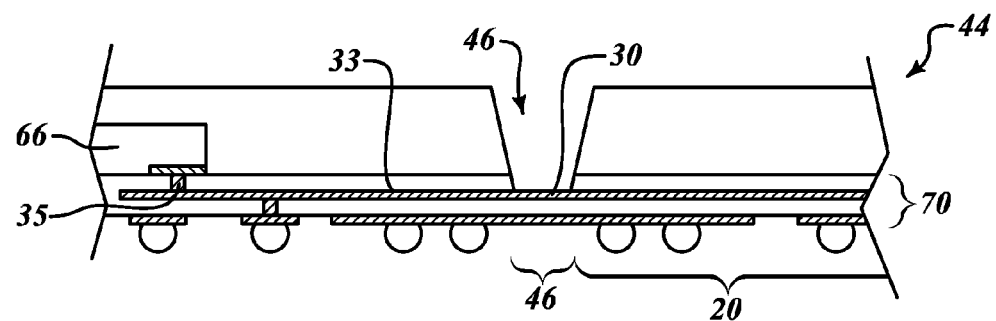
Figure 8E:
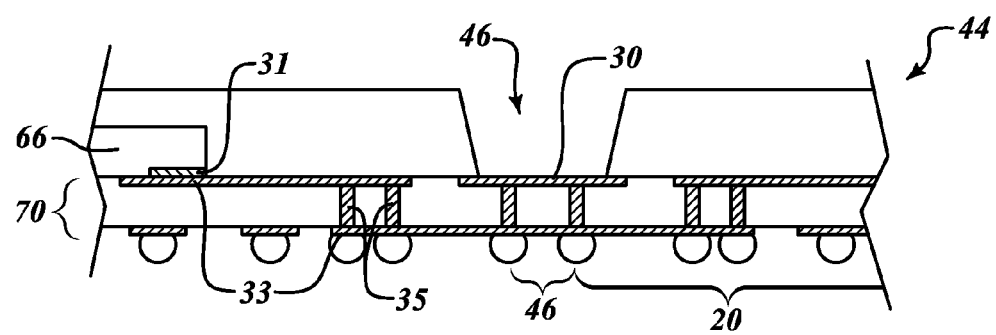

FIGS. 8C-8E illustrate different techniques by which the ground conductor 30 is coupled to the ground pin of the die 66. The ground conductor 30 revealed by cutting the groove 46 in the ball grid array electronic package array 44 is connected to a ground terminal 31 of an electronic circuit within the semiconductor die 66 by any acceptable technique. In one embodiment, shown in FIG. 8C, the ground conductor 30 connects directly to the semiconductor ground terminal 31 of the die 66. In another embodiment, shown in FIG. 8D, the ground conductor 30 connects with the semiconductor ground terminal 31 through a ground-connecting vias 35 within the circuit substrate 70. In another embodiment, shown in FIG. 8E, the ground conductor 30 connects with the semiconductor ground terminal 31 through a lateral conductor 33 and ground-connecting vias 35 within the circuit substrate 70 in the groove 46.

Figure 8F:
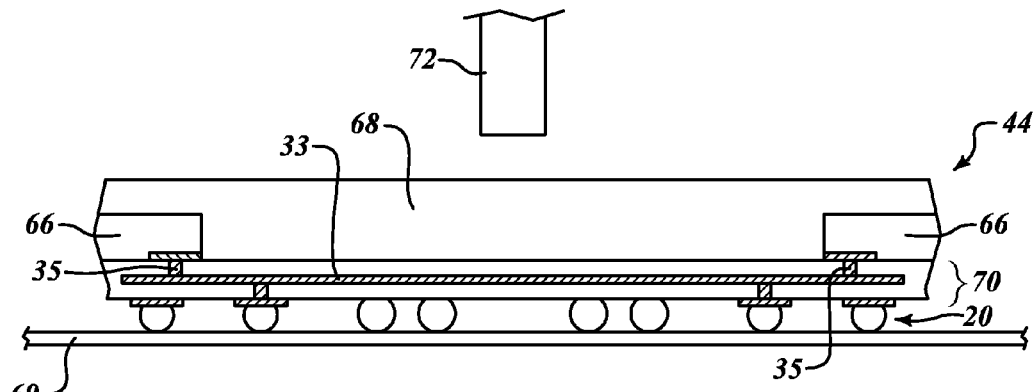
Figure 8G:
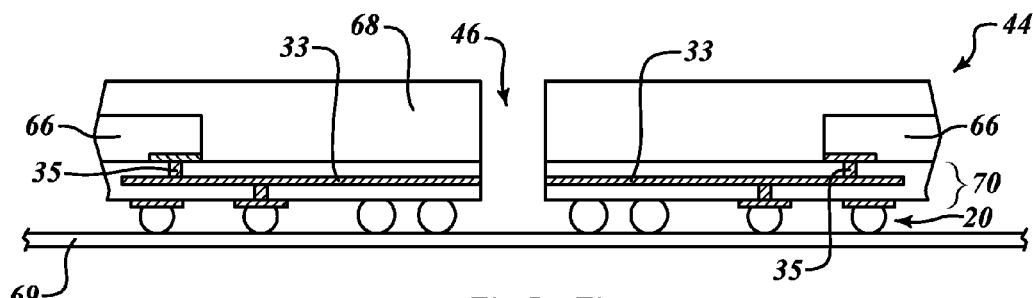
Figure 8H:
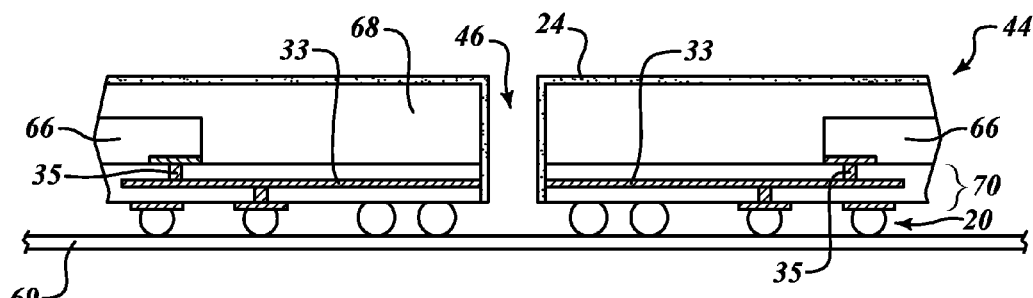

FIGS. 8F-8H show a further embodiment. The encapsulated die 66 are enclosed in an encapsulant 68 to form a large array, a portion of which is shown in FIG. 8F. The large array is coupled by an adhesive to a support base 69, which may be a tape, a carrier or other support. The individual packages are separated by completely sawing through the array and exposing a side wall of the ground conductor 33, shown in FIG. 8G. The packages are held in position be being adhered to the support based 69. A layer of conductive paint 24 is applied by the spray on technique described in detail herein, providing electrical contact to the ground conductor 33, thus effectively grounding and shield the entire package. In one embodiment, the support base 69 is not present and as soon as the packages are cut on all sides, they become singulated; in this embodiment, the many packages can be placed together in a chamber for applying the conductive paint 24 of can be individual sprayed with the paint layer 24.

In FIGS. 9A-9C, the ball grid array electronic package 20 resulting from the step of FIG. 8 is shown. FIGS. 9A and 9B show the ground conductor 30 exposed on the bottom of the groove 46 that becomes the perimeter ledge 34 of the ball grid array electronic package 20. FIG. 9C shows the slope on the sidewall 32 resulting from the V-shaped cutting blade 74.

Figure 10:
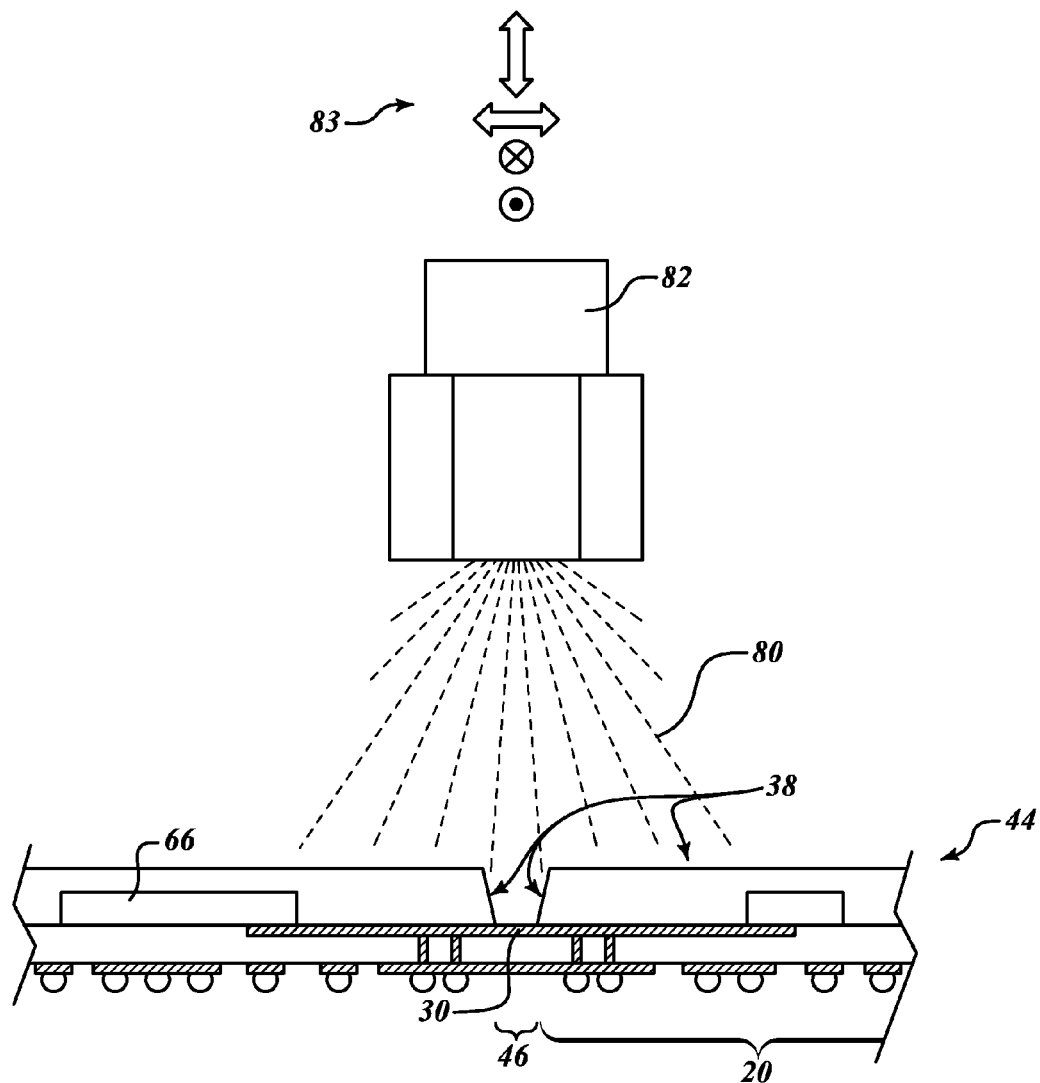
FIG. 10 shows a cut-away view of another step in a method of making a conductive paint EMI shield in accordance with one embodiment of the invention.

In FIG. 10, the ball grid array electronic package 20 is sprayed with a conductive paint 80 in fluid form that after curing becomes the conductive paint EMI shield 24. In one embodiment, the conductive paint 80 is a composed of metal particles suspended in a fluidic carrier and is applied to the total exposed surface 38 of the ball grid array electronic package 20 as a fluid while the package is still in array form. The ball grid array electronic package 20 of the array 44 is held in place while an overhead spray gun 82 passes over the array 44. The height of the spray gun 82 above the array 44 and the speed at which the spray gun 82 moves over the array 44 is selected to control the thickness of the applied conductive paint 80. In another embodiment the spray gun 82 is moved in two or more directions to achieve a selected coverage of the conductive paint 80 on the total exposed surface 38 of the packages of the array 44. In another embodiment, the spray gun 82 uses atomized spraying with a vertical gun position and the spray gun 82 travelling along at least two spraying paths or directions. In one embodiment the conductive paint 80 is sprayed onto the total exposed surface 38 of each individual ball grid array electronic package 20 in the array 44, including the ground conductors 30 exposed in the cutting of the grooves 46 between each package.

In one embodiment the composition of the conductive paint 80 coating includes copper, silver, stainless steel, nickel, or nickel coated with copper particles. In yet another embodiment, the conductive paint 80 is a Parker Chomerics or MAP-brand conductive paint product and the spray gun 82 is an Asymtek-brand coating system. The thickness of the resulting conductive paint EMI shield 24 is between 5 and 200 microns and has an electrical resistance of not more than 5 ohms per square. Preferably, it is much less than 1 ohm per square.

After applying the conductive paint 80 is cured. In one embodiment, the applied conductive paint 80 is cured in air at room temperature. In another embodiment the applied conductive paint 80 is oven-cured to more fully cure the applied conductive paint 80 or to increase the rate at which the applied conductive paint 80 cures.

Figure 11:
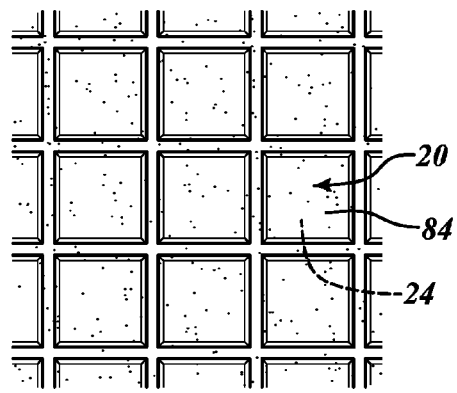
FIG. 11 shows in a top view a result of a step in a method of making a conductive paint EMI shield in accordance with another embodiment of the invention.

In FIG. 11, in accordance with one embodiment of the method, the ball grid array electronic package 20 receives a high-temperature epoxy-type black ink coating 84 over the conductive paint EMI shield 24. In one embodiment the epoxy-type black ink coating 84 is applied using a similar spray gun and conditions as used to apply the conductive paint 80. In another embodiment, the epoxy-type black ink coating 84 is applied with the same spray gun 82 as used to apply the conductive paint 80, the spray gun positioned in a vertical position and along at least two spraying directions to achieve the selected coverage on the total exposed surface 38. In accordance with another step of the method, the epoxy-type black ink coating 84 is cured.

Figure 12:
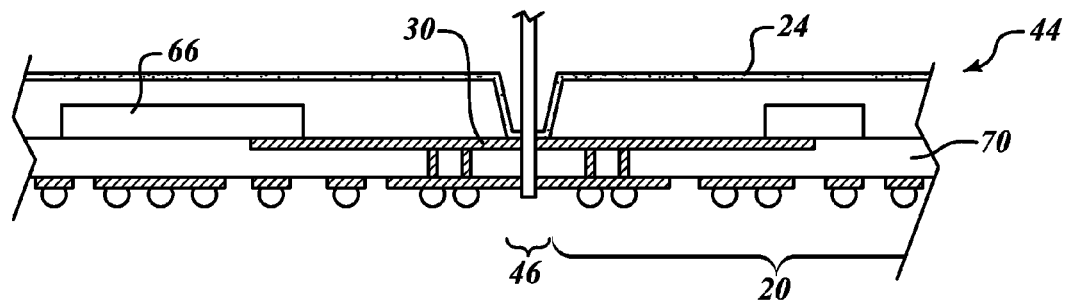
FIG. 12 shows a side, cut-away view of another step in a method of making a conductive paint EMI shield in accordance with one embodiment of the invention.

In FIG. 12, in accordance with another step of the method, the ball grid array electronic package 20 of the array 44 undergoes singulation to separate the ball grid array electronic package from other packages of the array. Singulation is achieved by placing a cut in each groove 46 between individual packages of the array 44, cutting through the epoxy-type black ink coating 84 (if applied), the conductive paint EMI shield 24, and the remaining thickness of the circuit substrate 70. According to one of several embodiments of the invention, the singulation cut is made using a cutting saw, as shown in FIG. 12, but may alternatively use a laser, a water jet, or other cutting methods.

FIGS. 13-19 show steps in a method of coating a camera module 50 with a conductive paint EMI shield 24. Some surfaces of the camera module 50 are masked to shield the lens 60 (as shown in FIG. 5) and the ball grid array electrical interconnect 64 from the conductive paint 80 applied during the method of making the conductive paint EMI shield 24. In other embodiments of the method, varying regions and surfaces of the camera module 50 may be masked. In still other embodiments, other kinds of electronic modules can be masked. All of these embodiments are considered within the scope of the invention.

Figure 13A:
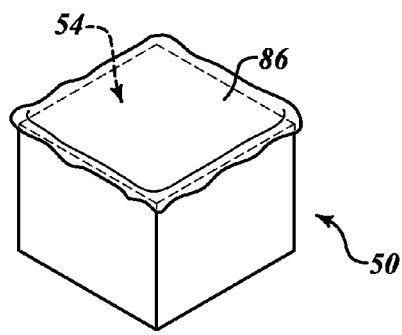
FIGS. 13A-13D show in isometric views alternate embodiments of a step in a method of making a conductive paint EMI shield.

The camera module has structures on two surfaces that must be protected from the conductive paint. The lens 60 on top surface 54 and the ball grid array 64 on bottom surface 56. One surface, either 54 or 56 is protected by being face down while the other surface must be masked. In FIGS. 13A-13D, the top surface 54 of one or more of the camera modules 50 is masked according to one of three embodiments of the method and the bottom surface 56 is face down. In FIG. 13A, a peelable mask 86 is used to shield the top surface 54 of each camera module 50. The peelable mask 86 is composed of a pliable, putty-like material that is applied by hand or machine over the surface of the camera module 50 requiring masking. Due to the putty-like consistency of the material, the peelable mask 86 can be applied to the top surface 54 at a thickness sufficient to cover vertical features such as balls of a ball grid array, or uneven surfaces such as the lens 60 and the lens aperture 62 of this embodiment. Conversely, if the surface requiring coverage is smooth, the peelable mask 86 can be made thin also. The peelable mask 86 also has the quality of easily releasing from the top surface 54 of the camera module 50 and doing so without leaving residue of the peelable material on the top surface.

Figure 13B:
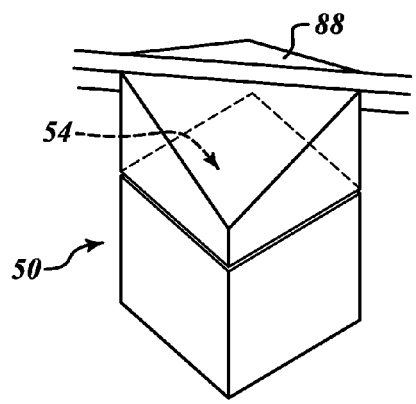
Figure 13C:
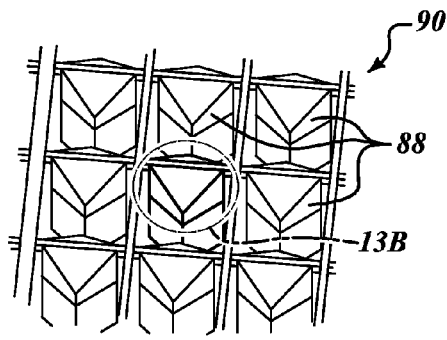
Figure 13D:
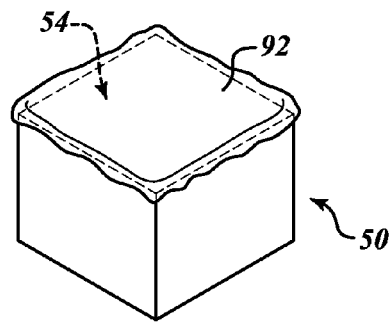

In FIG. 13B, a metal mask 88 is placed over the top surface 54 of the camera module 50. In one embodiment, the metal mask 88 is one element of an array of metal masks 90, each metal mask 88 occurring at a regular interval corresponding with the interval of an array of camera modules 50, as shown in FIG. 13C. The position of the metal masks 88 coincides with regions of the top surface 54 of the camera modules 50 requiring shielding during painting steps of the method.

Figure 17A:
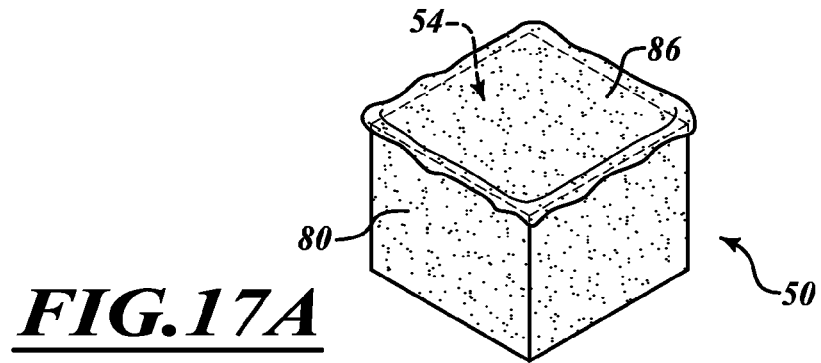
FIGS. 17A-17C show, in isometric views, results of a step in a method of making a conductive paint EMI shield in accordance with alternate embodiments of the invention.
Figure 17B:
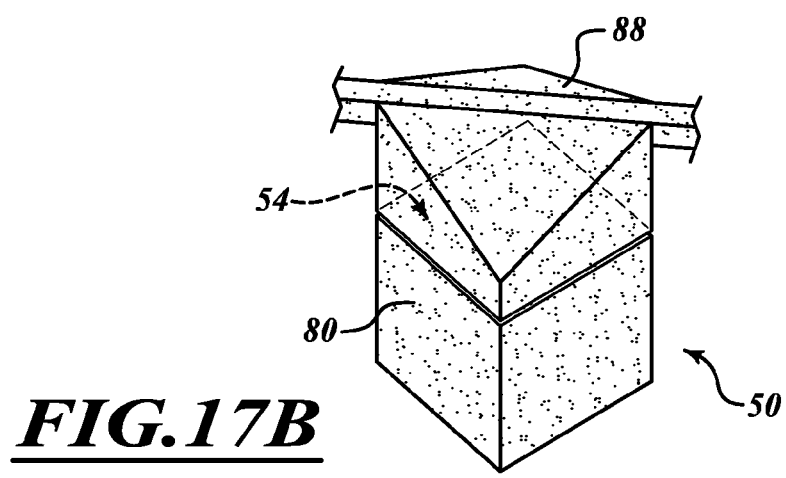
Figure 17C:
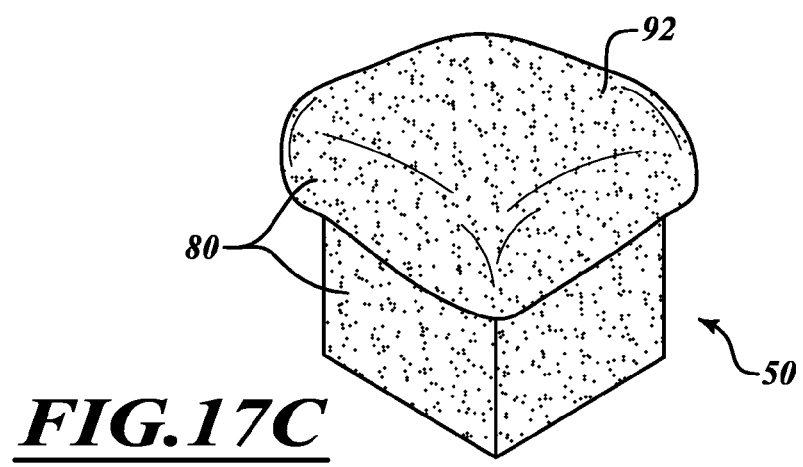

In a third embodiment of the method, a heat-expandable material 92 is applied by hand or machine over the surface of the camera module 50 requiring masking, as shown in FIG. 17C. The heat-expandable material 92 is conformable and therefore can be applied to the top surface 54 of the camera module 50 at a thickness sufficient to cover vertical features such as balls of a ball grid array, or uneven surfaces such as the lens 60 and the lens aperture 62 of this embodiment. Conversely, if the surface requiring coverage is smooth, the heat-expandable material 92 can be made thin also. The heat-expandable material 92 also has the quality of expanding under elevated temperature to ease release of the heat-expandable material 92 from the top surface 54 of the camera module 50.

In another step of one embodiment of the method, the masked camera module 50 is coated with the high-temperature epoxy-type black ink coating 84. During coating, any one of the three masking embodiments described above is used to cover regions of the camera modules 50 that require masking. Application of the epoxy-type black ink coating 84 is completed using a method and materials similar to the those described previously for applying the epoxy-type black ink coating 84 to the ball grid array waver-level package 20.

Figure 14A:
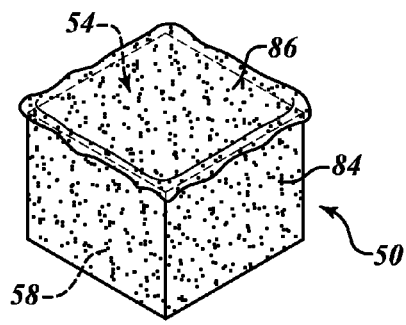
FIGS. 14A and 14B show in isometric views alternate embodiments of another step in a method of making a conductive paint EMI shield.
Figure 14B:
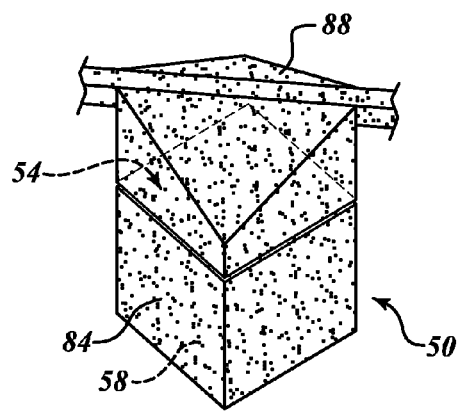

In another step of an embodiment of the method, the epoxy-type black ink coating 84 is cured using oven curing. In each of FIGS. 14A and 14B, a camera module 50 coated with the epoxy-type black ink coating 84 after curing for the peelable mask 86 and the metal mask 88 embodiments is shown. In FIGS. 14A and 14B, the epoxy-type black ink coating 84 covers sidewalls and the exposed regions of any glass portion of the camera module 50. The epoxy-type black ink coating 84 serves as a primer for the conductive paint EMI shield 24, as well as a light shield to prevent stray light from reaching the lens 60 except through the lens aperture 62. Application of the conductive paint EMI shield 24 directly to the camera module 50 without the epoxy-type black ink coating 84 can lead to stray light still reaching the lens 60 or becoming reflected onto the lens 60 due to the reflectivity of the conductive paint EMI shield 24.

In an alternative embodiment of the method, the masking and coating steps of the method are repeated, once with the top surface 54 of the camera module 50 upward and again with the bottom surface 56 upward. This is accomplished by masking and coating from one side of the camera module 50, and then flipping the camera module and repeating the masking and coating steps from the other side.

Figure 15A:
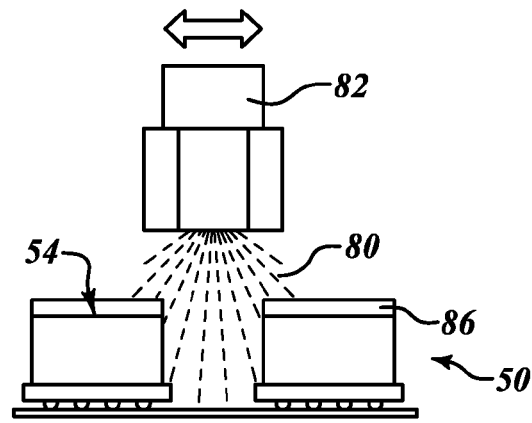
FIGS. 15A and 15B show side views of another step in a method of making a conductive paint EMI shield in accordance with one embodiment of the invention.
Figure 15B:
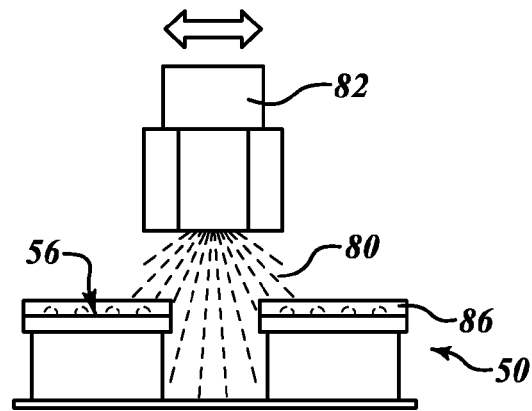

In FIGS. 15A and 15B, the camera module 50 receives the conductive paint 80 in fluid form that after curing becomes the conductive paint EMI shield 24. In FIG. 15A, the masked camera module 50 receives the conductive paint 80 over the black ink-coated camera module 50 in a top-side face-up position. In FIG. 15B, the camera module 50 is flipped and the masked camera module 50 receives the conductive paint 80 over the epoxy-type black ink coating 84 in a bottom-side up position. The height and speed of movement of the spray gun 82, the rate at which the conductive paint 80 is applied, the size of the spray particles (i.e., the level of atomization), and the number of directions in which the spray gun 82 moves with respect to the camera modules 50 are all selected to achieve a selected conductive paint EMI shield 24, including complete coverage of the conductive paint EMI shield 24 on selected regions and surfaces of the camera module 50. FIGS. 15A and 15B show this step of the method using the peelable mask 86 for masking, but other embodiments for masking are also within the scope of the invention.

Figure 16:
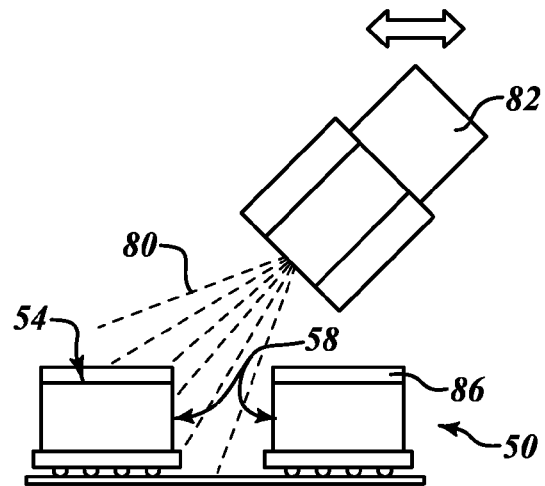
FIG. 16 shows a side view of another step in a method of making a conductive paint EMI shield in accordance with one embodiment of the invention.

In FIG. 16, in a further embodiment of the method, the conductive paint 80 is applied under similar conditions to those described above, but with the spray gun 82 inclined at an angle of between 20° and 70° to the top and bottom surfaces 54, 56. The benefit of an embodiment of the method that uses inclined spraying is that the sidewalls 58 of the camera module 50 are more accessible, which is advantageous for tall electronic modules such as the camera module 50. FIG. 16 shows this step of the method using the peelable mask 86 for masking, but other embodiments for masking are also within the scope of the invention.

The spray gun for the camera module 50 can also be moved as desired in all three dimensions, namely front to back, side to side and up to down, as described previously with respect to FIG. 10. The camera module 50 is therefore assured of being properly and completely coated with conductive paint except in those locations that are masked.

In another step of the method, the conductive paint 80 is cured either in air at room temperature or in an oven. In FIGS. 17A-17C, the camera modules 50 are shown coated with the conductive paint 80 after curing for embodiments of the method using the peelable mask 86, the array of metal masks 90, and the heat-expandable material 92.

In another step of an embodiment of the method, the masking is removed. In the embodiment that uses the peelable mask 86, the peelable mask 86 is peeled away from the masked surface or surfaces of the camera module 50. In one embodiment, the peelable mask 86 strips cleanly from the top and bottom surfaces 54, 56 of the camera module 50, leaving no mask material behind on the ball grid array electrical interconnect 64 or on the lens 60. In the embodiment that uses the metal mask 88, the array of metal masks 90 is removed from the array of arranged camera modules 50.

In the embodiment that uses the heat-expandable material 92, during curing of the conductive paint 80, the heat-expandable material 92 expands in size. By expanding, the heat-expandable material 92 separates from the surface of the camera module 50, easing release of the heat-expandable material 92 from the top and bottom surfaces 54, 56 of the camera module 50. The heat-expandable material 92 is then peeled away from the masked top and bottom surfaces 54, 56. In one embodiment, the heat-expandable material 92 strips cleanly from the top and bottom surfaces 54, 56 leaving no mask material behind on the ball grid array electrical interconnect 64 or on the lens 60.

Figure 18A:
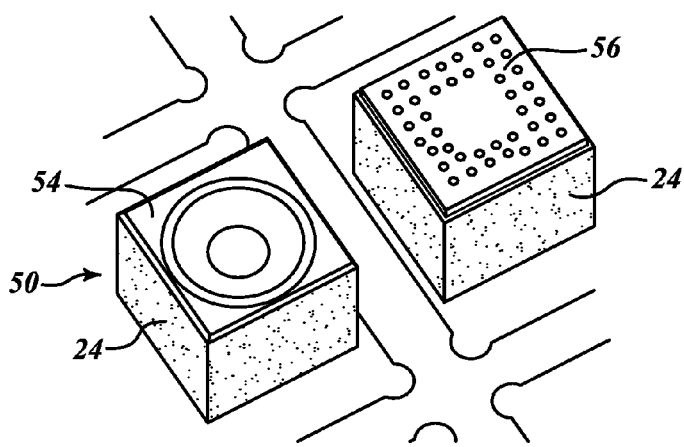
FIGS. 18A, 18B, and 19 show, in isometric views, results of still another step in a method of making a conductive paint EMI shield in accordance with an embodiment of the invention.
Figure 18B:
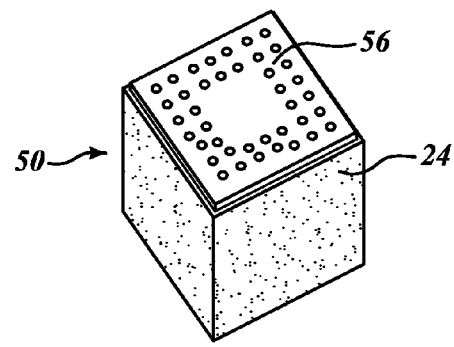

In FIGS. 18A and 18B the conductive paint EMI shielded camera module 50 is shown. FIG. 18A shows the top and bottom surfaces 54, 56 of the camera module 50 for the embodiment of the method that uses the peelable mask 86 or the heat-expandable material 92. FIG. 18B shows the bottom surface 56 for the camera module 50 of the embodiment of the method that uses the metal mask 88. In either embodiment the top and bottom surfaces 54, 56 are free of the conductive paint EMI shield 24. In one embodiment the thickness of the conductive paint EMI shield 24 is from 5 to 200 microns thick and the electrical resistance of the conductive paint EMI shield 24 not more than 5 ohms. In another embodiment, the conductive paint EMI shield 24 is composed of copper, silver, stainless steel, nickel, or nickel coated with copper particles.

In one possible embodiment, the conductive coating can be transparent, such as an Indium Tin oxide, of the type used in touch screens and LCD pads. The transparency of the coating would permit the conductor to be sprayed on the lens itself with no mask needed at all. The advantage of using a transparent conductor is that the use of a mask is avoided completely since the array 64 can face downward. Another advantage is that greater static and EMI protection is provided since the coating will cover the entire module, including the lens and all other module parts except for the signal and power pins of the ball grid array. The disadvantage is that the resistance is slightly higher than for a silver or copper metal paint and may also degrade the optical properties of the lens 60. However, the lens 60 is for a cell phone and not a high quality camera, so having a thin coating over the lens 60 will be acceptable in some embodiments.

Figure 19:
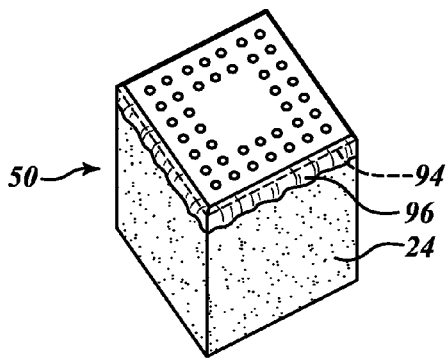

In FIG. 19, in another embodiment of the method, the camera module 50 undergoes a conductive-glue sealing that electrically connects the conductive paint EMI shield 24 to at least one ground conductor 94 on the camera module 50. In one embodiment, glue sealing is achieved by one of spray or needle-type dispensing of an electrically conductive glue 96 and is performed manually or using an automatic dispensing machine. In an alternative embodiment, the electrical connection between the conductive paint EMI shield 24 and the ground conductor 94 is made by the application of the conductive paint 80 directly to the ground conductor 94.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic module comprising:
    a distribution layer having a first surface and side surfaces, the side surfaces being transverse to the first surface;
    an integrated electronic circuit attached to the first surface of the distribution layer;
    a rigid body enclosing at least a portion of the electronic circuit;
    a ground conductor electrically coupled to the electronic circuit, the ground conductor extending from the integrated electronic circuit to one of the side surfaces of the distribution layer, the ground conductor having a coupling surface that is coplanar with the one of the side surfaces of the distribution layer, the ground conductor being positioned within the distribution layer and extending between the integrated electronic circuit and one of the side surfaces;
    a plurality of electrical interconnect elements formed in the distribution layer and electrically coupled to the integrated electronic circuit; and
    an electrically conductive film adhered to an exterior surface of the rigid body and to the side surfaces of the distribution layer, the film being in contact with the coupling surface of the ground conductor and electrically isolated from a group of the plurality of electrical interconnects.

2. The module of claim 1 wherein the ground conductor lies along an external perimeter edge of the rigid body.

3. The module of claim 1, the exterior surface of the rigid body comprising a top surface and a sidewall, wherein the top surface and the sidewall meet at an obtuse angle.

4. The module of claim 1, further comprising a lens enclosed by the rigid body and optically coupled with an image-sensing portion of the electronic circuit.

5. The module of claim 1 wherein the electrically conductive film is composed of at least one of copper, silver, stainless steel, nickel, and nickel coated with copper particles.

6. A package, comprising:
    a distribution layer having a first surface, a second surface, and side surfaces, the distribution layer;
    a die on the first surface of the distribution layer;
    a ground conductor extending from the die to one of the side surfaces of the distribution layer, the ground conductor having a coupling surface that is accessible from the one of the side surfaces;
    an encapsulation material on the die and on the first surface of the distribution layer; and
    an electrically conductive film formed on the encapsulation material and on the side surfaces of the distribution layer, the film being in contact with the coupling surface of the ground conductor accessible from the one of the side surfaces, the coupling surface of the ground conductor is coplanar with the side surfaces of the distribution layer and the sidewalls of the encapsulation material.

7. The package of claim 6 wherein a contact on the die is coupled to the ground conductor.

8. The package of claim 6 further comprising a plurality of electrical connections formed on the second surface of the distribution layer, one of the electrical connections being coupled to the ground conductor.

9. The package of claim 6 wherein sidewalls of the encapsulation material are coplanar with the side surfaces of the distribution layer.

* * * * *